United States Patent [19]

Nashimoto

[11] Patent Number: 5,147,498
[45] Date of Patent: Sep. 15, 1992

[54] APPARATUS FOR CONTROLLING TEMPERATURE IN THE PROCESSING OF A SUBSTRATE

[75] Inventor: Kiyoshi Nashimoto, Fuchu, Japan
[73] Assignee: ANELVA Corporation, Tokyo, Japan
[21] Appl. No.: 680,938
[22] Filed: Apr. 5, 1991
[30] Foreign Application Priority Data
Apr. 9, 1990 [JP] Japan .................. 2-37891[U]
[51] Int. Cl.⁵ ............................ H01L 21/00
[52] U.S. Cl. .................. 156/627; 156/626; 156/345; 118/725; 427/8; 204/192.13; 204/192.33
[58] Field of Search ............ 156/626, 627, 345; 427/8; 204/298.03, 192.13, 298.32, 192.33; 118/725

[56] References Cited

U.S. PATENT DOCUMENTS

| | | | |
|---|---|---|---|
| 4,147,571 | 4/1979 | Stringfellow et al. | 118/725 |
| 4,543,576 | 9/1985 | Hieber et al. | 204/192.13 |
| 4,913,790 | 4/1990 | Narita et al. | 156/626 |
| 4,987,856 | 1/1991 | Hey et al. | 118/725 |

FOREIGN PATENT DOCUMENTS 59-025227 2/1984 Japan.
62-093921 4/1987 Japan.

OTHER PUBLICATIONS

The American Heritage Dictionary of the English Language; ©1969; pp. 1336, 427.

Primary Examiner—David A. Simmons
Assistant Examiner—George Goudreau
Attorney, Agent, or Firm—Wenderoth, Lind & Ponack

[57] ABSTRACT

The temperature of a substrate, such as a semiconductor wafer, is controlled in the processing of the substrate, such as sputtering, etching, deposition, or the like. According to the present invention, an accurately controlled temperature environment may be achieved by measuring the temperature and emissivity of heat from the surface of the substrate being processed, remotely as well as on a real-time basis, and correcting the temperature to reflect the actual temperature according to the emissivity as measured.

10 Claims, 6 Drawing Sheets

APPARATUS FOR CONTROLLING TEMPERATURE IN THE PROCESSING OF A SUBSTRATE

BACKGROUND OF THE INVENTION

1. Field of the Invention

The present invention relates to the processing of a substrate such as the sputtering, etching, deposition or other processes. More particularly, the present invention provides a method and an apparatus in and by which the processing of the surface of a semiconductor wafer or a substrate (which will be simply referred to as "substrate" hereafter) can proceed under an optimally controlled environment.

2. Description of the Prior Art

The conventional processing of the surface of a substrate such as any of the sputtering, etching, depositing, and other processes must usually carried out by accurately controlling the temperature of the substrate during the sputtering process, etc., since the results from the sputtering process, etc. may depend largely upon the temperature of the substrate being processed.

One of the preferred approaches that addresses the problem of measuring the actual temperature of a substrate during the sputtering process, etc. may be to use a thermopile temperature sensor to measure the temperature in a non-contacting manner which is typical in the prior art.

The thermopile sensor includes a large number of thermocouples which are sensitive to any thermic or heat rays from the surface of a substrate being processed. This sensor provides output that represents the actual temperature value of the substrate being processed at every moment. It is noted that a substrate being processed has an inherent emissivity that may vary, depending upon the kind of material, surface conditions, and other factors. For this reason, the thermopile sensor cannot provides the accurate measurement of the actual temperature of the substrate in response to those different heat rays. In the prior art, the thermopile sensor is primarily used to measure the temperature of the surface of the substrate. When a thin film is formed during a depositing process in particular, this sensor cannot be used to measure the actual temperature of the substrate being processed. During the deposition process, therefore, it is practically impossible to monitor any abnormal or unusual change in the temperature on a real time basis.

SUMMARY OF THE INVENTION

It is accordingly one object of the present invention to provide a method and an apparatus in and by which any of the sputtering, etching, deposition, and other processes can achieve consistent results by the real-time monitoring of momentary change in the temperature of a substrate being processed.

Another object of the present invention is to provide a method and an apparatus in and by which the accurate measurement of the actual temperature of a substrate being processed can be carried out.

Specifically, the method according to the present invention permits any of sputtering, etching, deposition, and other processes to to be carried out on the surface of a substrate consistently by measuring the actual temperature of the substrate from its back side and controlling the temperature if any deviation from the specific temperature range is detected.

The apparatus according to the present invention may be used with a substrate processing apparatus that performs the sputtering, etching, deposition, or other processes on functions for the surface of a substrate which is held in position on its holder within a vacuum chamber, wherein the substrate holder has a central hole through which the back side of the substrate on the holder is exposed, and wherein a contactless temperature sensor is provided which is aligned on an axial line through the hole so as to face opposite the back side of the substrate.

Preferably, the contactless temperature sensor may be a thermopile sensor. To correct any errors that may be caused by the different heat emissivities provided by the substrates when their actual temperatures sensed by the thermopile sensor, an emissivity measuring device may be provided on the transfer path through which a substrate to be processed is carried to its holder, and may be located to face opposite the back side of the substrate. The emissivity measuring device responds to any change in the heat emissivity that it detects, and provides the corresponding error correction output signal for the thermopile sensor.

Both the emissivity measuring device and the thermopile sensor may be arranged on the substrate transfer path within the processing chamber, as described above, but the thermopile sensor may be located within the processing chamber while the emissivity measuring device may be located within a different chamber such as the load lock chamber which is usually separate from the processing chamber.

According to the method and apparatus of the present invention, the temperature of a substrate can be measured in a continuous fashion while the substrate is being processed, and the particular process, such as sputtering, can proceed under temperature-controlled processing conditions.

The present invention provides the accurate measurement of the actual temperature of a particular substrate being processed, by allowing the emissivity measuring device to detect any error and to provide the corresponding correction signal which accurately reflects actual temperature.

BRIEF DESCRIPTION OF THE DRAWINGS

These and other objects, features, and merits of the present invention will become more apparent from the detailed description of several preferred embodiments that follows by referring to the accompanying drawings, in which.

DETAILED DESCRIPTION OF THE PREFERRED EMBODIMENTS

The present invention will now be described by referring to several preferred embodiments thereof which are shown in the accompanying drawings. In the following description, those embodiments are described with respect to the sputtering process, although they may be applicable to other processes, such as etching, depositing, and the like.

SUBSTRATE TEMPERATURE CORRECTION

Figure 1:
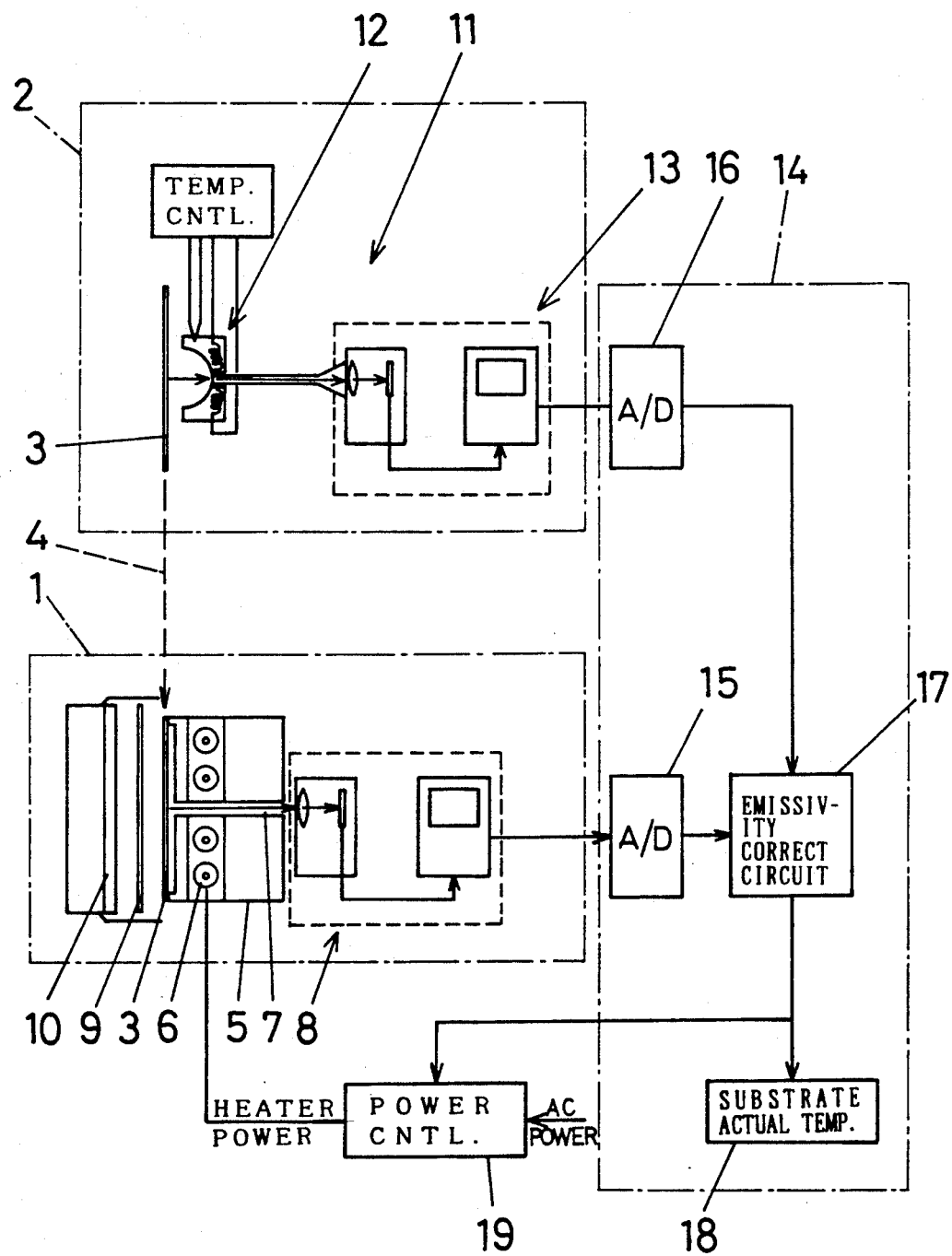
FIG. 1 is a block diagram illustrating one preferred embodiment of processing control apparatus according to the present invention.

The sputtering apparatus in which the present invention may be implemented includes a sputtering chamber 1 and a load lock chamber 2 as shown in FIG. 1. There is a transfer path 4 through which a substrate 3 is carried between those two chambers 1 and 2.

A substrate 3 is held by its holder assembly 5 within the sputtering chamber 1. The holder assembly 5 includes a heater 6 and a coolant circulating conduit (not shown), which are built in the holder assembly 5. Furthermore, the holder assembly 5 has a central hole 7 through which a thermopile temperature sensor located outside the holder assembly 5 can sense the heat from the back side of the substrate 3 being processed. The substrate 3 held by the holder assembly 5 faces opposite a cathode 10 with an intervening shutter 9 being interposed between the holder assembly and cathode. When a voltage is applied across the holder assembly 5 and cathode 10 by turning the power on, the shutter 9 is opened, allowing any material sputtered by the cathode 10 to be deposited onto the surface of the substrate 3.

Within the load lock chamber 2, a heat emissivity measuring device 11 is provided at a position where a substrate 3 to be processed is held by any suitable holder (not shown), and faces opposite the substrate 3 on the holder. The heat emissivity measuring device 11 provides output that represents the corresponding emissivity value in response to the temperature values of a black body heater 12, which has a unity (1=100%) of emissivity value, and as measured at the back side of the substrate 3 by a thermopile sensor 13. As it may be appreciated from the above description, the heat emissivity measuring device 11 is located within the load lock chamber 2, rather than anywhere outside the chamber 2. This is obviously because higher accuracy can be provided when the emissivity is measured a vacuum within the chamber 2 than when it is done in the atmosphere outside the chamber 2.

The output of each of the thermopile sensors 8, 13 is connected to the input of each respective one of A/D converters 15, 16 in a sequencer block 14. The output signal from each thermopile sensor 8, 13 is fed to the corresponding A/D converter 15, 16 which provides a digital signal, which is delivered to an emissivity correction circuit 17 (usually in the form of a divider). The output of the emissivity correction circuit 17 is connected to a display circuit 18 on which the actual temperature of the substrate as measured and corrected is presented. The output of the emissivity correction circuit 17 is also connected to a power controller 19 which switches on or off the AC power to the heater 6 in the holder assembly 5. The power controller 19 operates under the control of a control signal from the emissivity correction circuit 17, and controls the power to the heater 6 in accordance with the temperature values of the substrate as measured. Thus, the temperature of the substrate 3 being processed is regulated to the required temperature. Whenever the substrate being processed is to be to cool, it may be left cooled by itself or it may be forced to be cooled by circulating any coolant through the circulating path (not shown) in the holder assembly 5.

In accordance with the embodiment described above by referring particularly to FIG. 1, the temperature of the substrate 3 being processed, such as by cathode sputtering in this case, can be measured in a continuous fashion. The temperature of the substrate 3 as measured by the thermopile sensor 8 within the sputtering chamber 1 may be corrected by the emissivity correction circuit 17 within the sequencer 14 in response to the actual emissivity value of the substrate 3 as previously measured by the emissivity measuring device 11 within the load lock chamber 2. Thus, the actual temperature of the substrate 3 being processed in the sputtering chamber 1 can be regulated with high accuracy.

SUBSTRATE TEMPERATURE CONTROL

Figure 2:
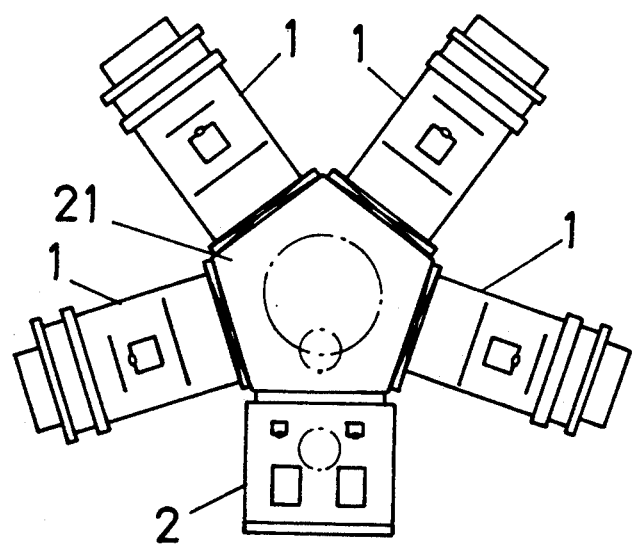
FIG. 2 is a plan view showing a multi-chamber configuration of a preferred embodiment of a processing device according to the present invention.

Referring next to FIG. 2, the multi-chamber configuration includes a separation chamber 21, which includes a single load lock chamber 2 and a plurality of sputtering chambers 1. As a pre-stage step to processing of a substrate 3, the substrate is heated within the separation chamber 21, for example to a specific temperature. Then, the previously heated substrate 3 is carried into the appropriate one of the sputtering chambers 1 where the sputtering process is performed. In the sputtering chamber 1, the substrate 3 waits for a specific period of time until it reaches its specific initial temperature before the sputtering (thin film depositing) process begins. This period of time should be as short as possible in order to provide high throughout (increased productivity). It is possible, however, that changes in the initial temperature of the previously heated substrate may be caused by any external factor during the transfer of the substrate to the appropriate sputtering chamber 1. If such a change occurs, the sputtering process cannot be performed consistently for every substrate because there are variations in the initial temperature of every substrate 3 before the sputtering process actually begins. If any change in the initial temperature should be encountered for a particular substrate prior to its sputtering process, the particular substrate might contain defects after it has been processed. As a result, the total yield may be reduced. Such change may also occur during the sputtering process, which may further increase the number of defective products.

Figure 3:
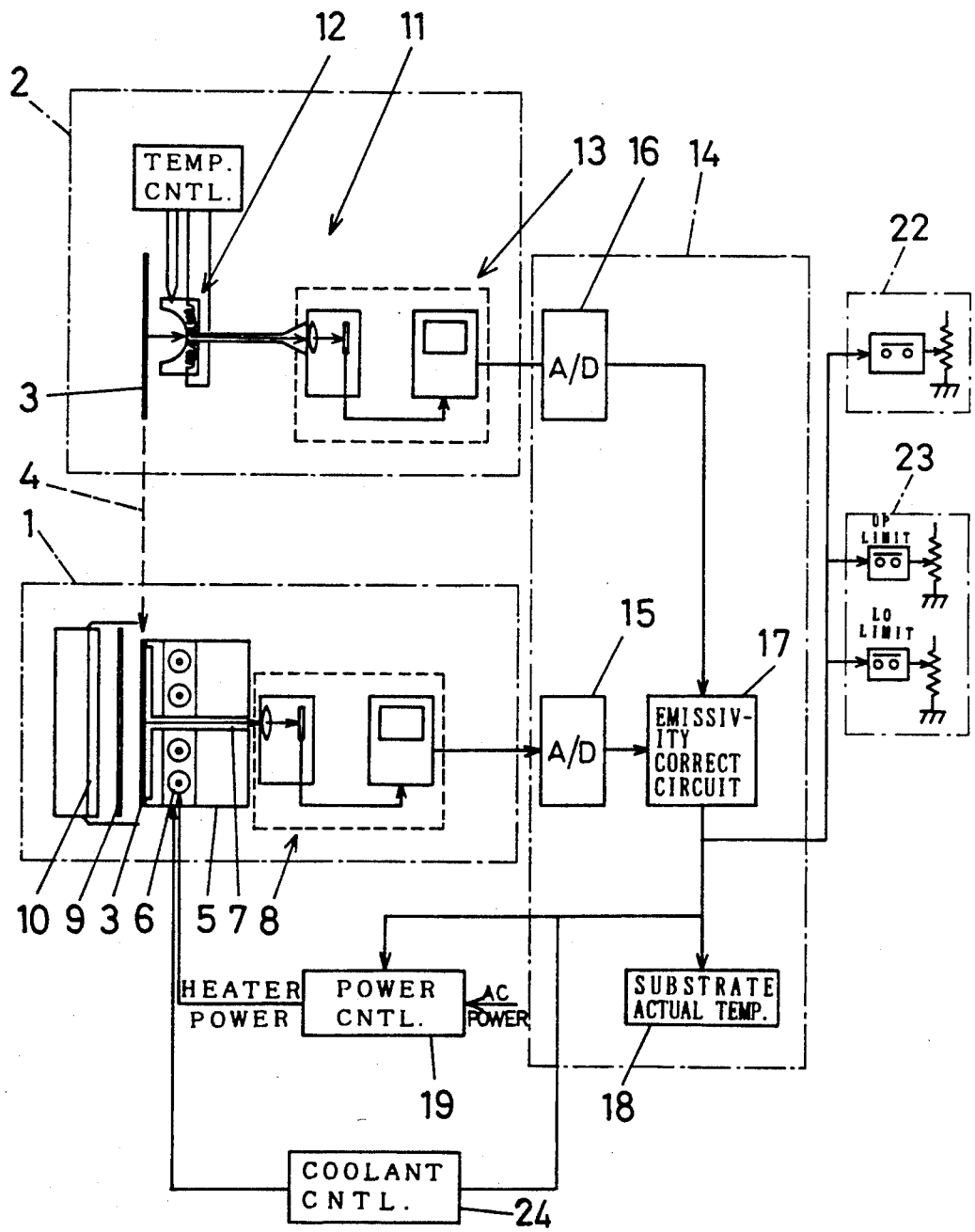
FIG. 3 is a block diagram including an initial temperature controller and temperature range controller in one preferred embodiment of the processing control apparatus according to the present invention.

As a variation of the embodiment shown in FIG. 1, the apparatus as shown in FIG. 3, further includes an initial temperature controller 22 and a temperature range controller 23, both of which are connected to the output of the emissivity correction circuit 17. Those controllers 22 and 23 control the sputtering process controller (not shown).

The initial temperature controller 22 includes a voltage comparator that compares the voltage representing the temperature of the substrate as measured with the reference voltage preset. This controller 22 controls the aforementioned period of time automatically until the temperature, or voltage, of the substrate reaches the reference voltage. The temperature range controller 23 includes two similar voltage comparators each of which compares the voltage representing the temperature of the substrate as measured with the respective reference voltage preset. One voltage comparator compares the voltage with the upper limit reference, and the other voltage comparator compares the voltage with the lower limit reference. Both the reference limits are previously set to respective specific values. Thus, the initial temperature range may be maintained within those upper and lower limits.

Figure 4:
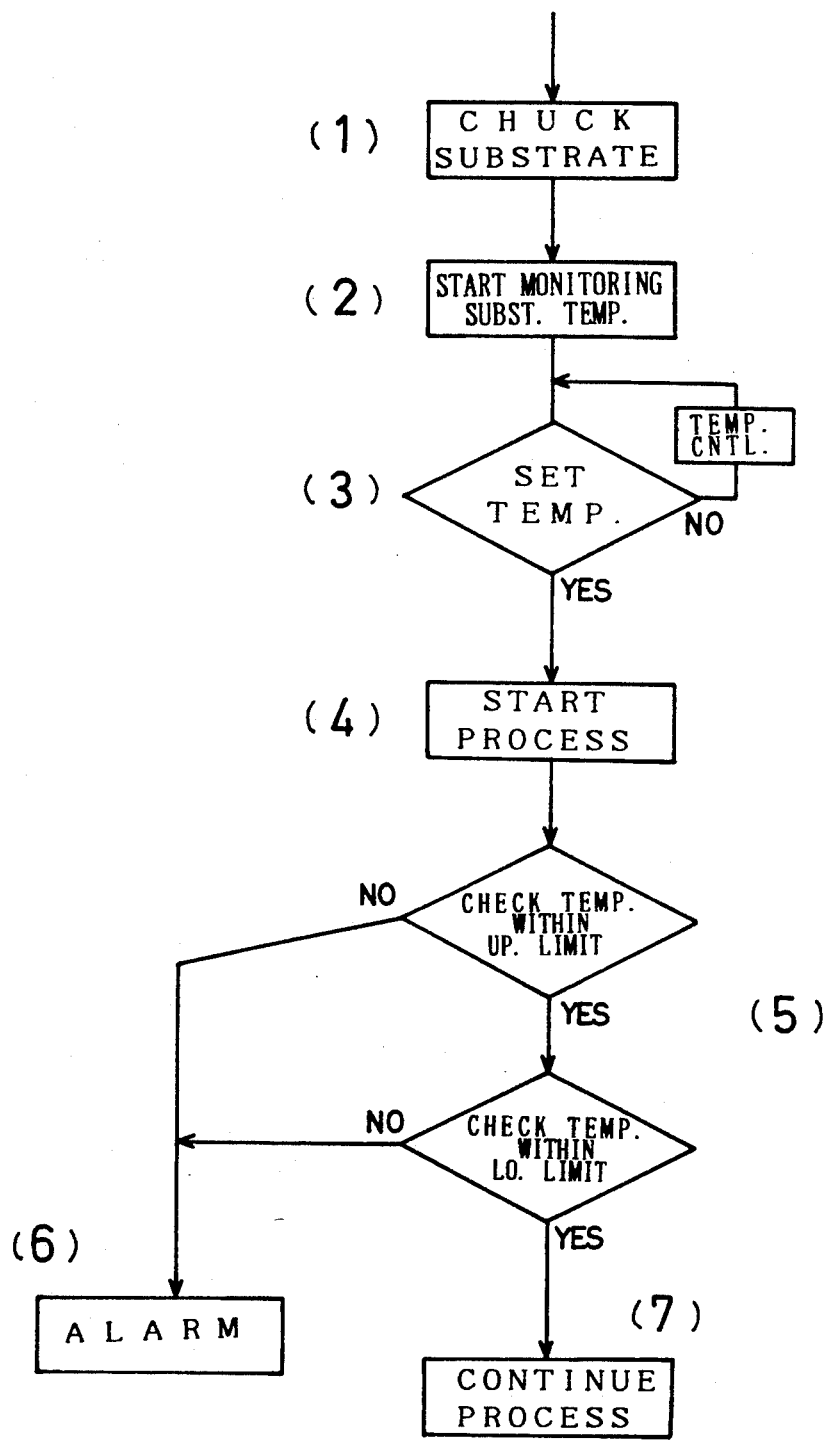
FIG. 4 is a flowchart showing the sequential temperature control steps in the method according to the present invention.
Figure 5:
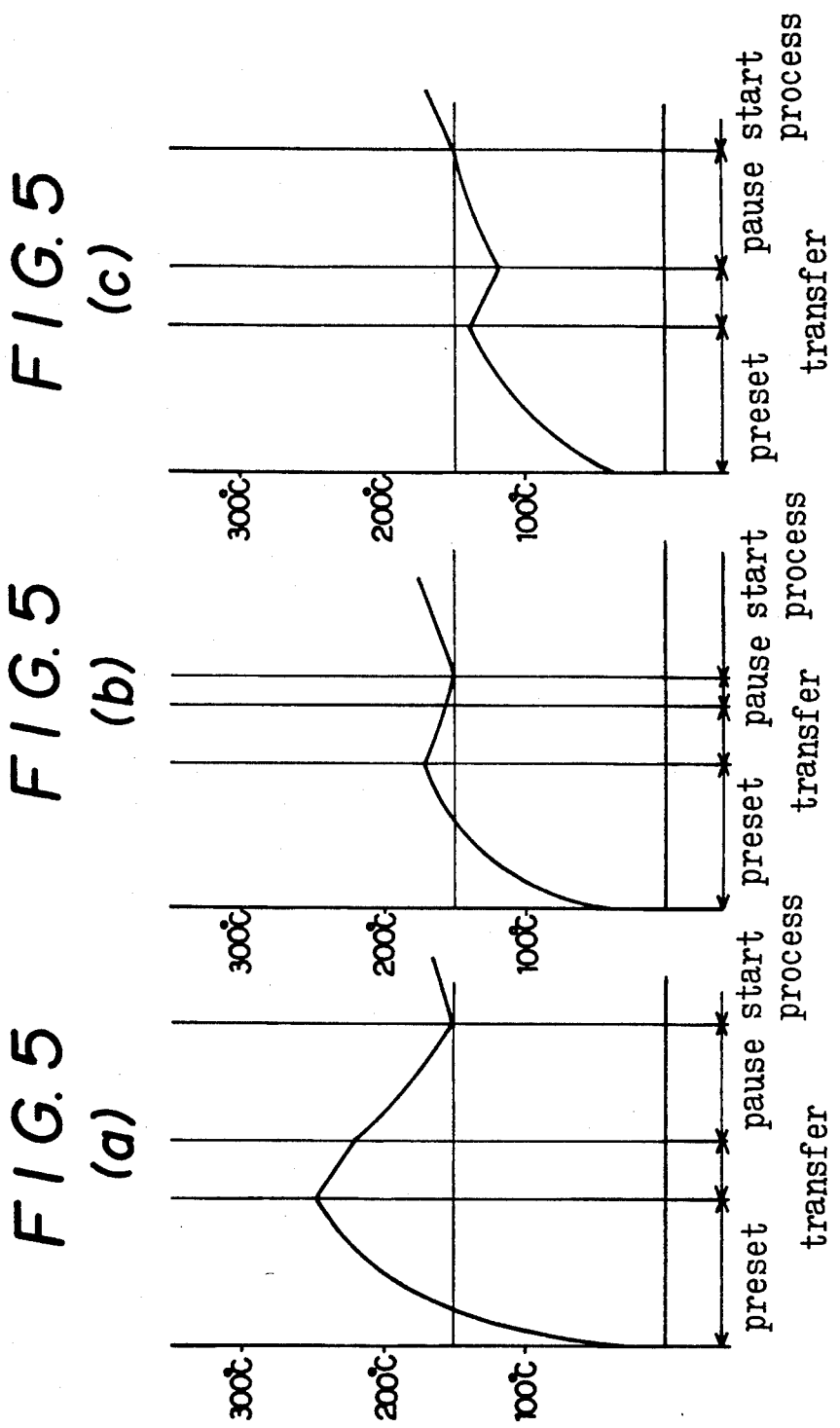
FIGS. 5(a), (b), and (c) are diagrams showing how the temperature changes in different environments, respectively, before a substrate begins to be processed at its initial temperature.

The temperature monitoring sequence during the sputtering process will now be described by using the flowchart shown in FIG. 4. A substrate 3, which is previously heated to the specific initial temperature within the separation chamber 21, is transferred into the appropriate sputtering chamber 1 where the substrate is chucked (step 1). Then, the substrate temperature monitoring is started (step 2). Like the preceding embodiment shown in FIG. 1, the temperature measuring device measures the temperature of the substrate, which is corrected to reflect the actual temperature value in accordance with the emissivity value as measured. If the actual temperature is found to deviate from the initial predetermined temperature set in the initial temperature controller 22, the controller 22 is actuated to provide a temperature value that conforms to the set temperature (step 3). If it is then found that the temperature of the substrate as measured is above the initial set temperature, the substrate is heated to the initial set temperature value, as shown in FIG. 5(c). During this heating process, the temperature also continues to be measured. When the substrate is heated, the heater in the present invention may be used together with a lamp gas heater built in the substrate holder, such as the one disclosed in Japanese Utility Model Application No. 2-37890. In this way, the heating requirements may be controlled accurately, and the initial set temperature may be reached in a shorter period of time.

It may be appreciated from the above description that any deviation of the actual temperature as measured from the initial set temperature can continue to be detected, and the substrate may be heated or cooled, depending upon the results of detection. This provides the accurate temperature control which shortens the time in reaching the initial set temperature.

When the substrate teaches the initial set temperature, the next step is to start the substrate sputtering process (step 4). During the sputtering process, the temperature of the substrate being processed continues to be measured, at every moment, from the back surface of the substrate. The temperature range controller 23 monitors the temperature of the substrate being processed at every moment, in order to ensure that it falls within the upper and lower limits (step 5). This monitoring occurs alternately between the upper and lower limits. If it is found that the temperature as detected is outside the range between the upper and lower limits, an alarm may then be actuated to sound a warning to the operator that there is a problem (step 6). If any problem is detected, and when it cannot be determined what actually caused the temperature as measured to deviate from the specific temperature range, the sputtering apparatus should be stopped, rather than permitting the power controller 19 to control the temperature of the substrate being processed. If no such problem is happening, the sputtering apparatus will continue its processing (step 7). Of course, instead of stopping the sputtering apparatus, the temperature of the substrate being processed may be adjusted. The temperature adjustment of the substrate may be carried out by the power controller 19 and a coolant controller 24 which receive a signal indicative of the actual temperature of the substrate from the emissivity correction circuit 17, and control the temperature of the holder assembly 5.

Figure 6:
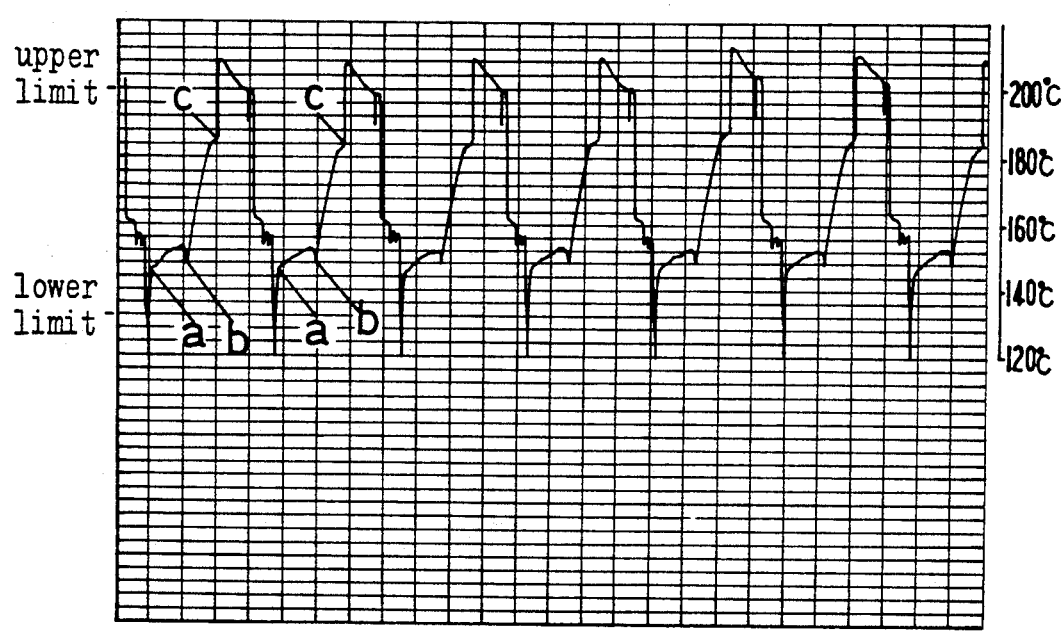
FIG. 6 is a graph of data obtained by measuring the actual temperature of several substrates being processed in the environment achieved when the preferred embodiments of the present invention are implemented.

FIG. 6 depicts a graph of temperature data for the substrates obtained when each single substrate is processed one at a time. In FIG. 6, the point "a" indicates the time at which a single substrate to be processed was set up on its holder assembly 5, and the points "b" and "c" indicate the time interval during which the sputtering (or thin film depositing) process was performed on the substrate. The point "c" also indicates the time at which the sputtering process was finished and the substrate was ready to be removed from its holder assembly 5. During the sputtering process, each individual substrate is maintained within the specific temperature range, in the manner as described above and as shown in FIG. 6.

The embodiments have been described so far with respect to the sputtering process, but they may be similarly applied to other processes, such as etching, vacuum deposition, and the like.

The present invention has been described in full detail by referring to the several particular preferred embodiments thereof. As it may be obvious from those embodiments, the present invention provides several advantages over the prior art. One of the advantages is the contactless substrate temperature measurement, which may be achieved by detecting the emissivity of heat from the surface of substrate undergoing a particular processing, such as sputtering, etching, deposition, and the like, and then correcting the temperature as measured according to the detected emissivity value. The temperature value obtained in this fashion reflects the actual temperature accurately. Another advantage is therefore the accurate control of the temperature of a substrate being processed, thereby permitting the particular processing to continue in proper sequence. A further advantage is the real-time monitoring for any changes in the initial set temperature and any changes in the processing temperatures, thereby permitting a plurality of substrates to be processed under consistent controlled temperature environments.

Although the present invention has been described with reference to the several specific preferred embodiments thereof, it should be understood that various changes and modifications may be made without departing from the spirit and scope of the invention as defined in the appended claims.

What is claimed is:

1. In the processing of a front surface of a substrate, a method for regulating the temperature of the substrate, said method comprising:

prior to the processing of the front surface of the substrate, a first step of temperature sensing including sensing the temperature of heat emitted from a back surface of the substrate, opposite the front surface to be processed, through a space that is free of obstacles with a sensor disposed out of contact with the substrate and facing the back surface thereof;

as the front surface of the substrate is being processed, a second step of temperature sensing including sensing the temperature of heat emitted from the back surface of the substrate through a space that is free of obstacles with a sensor disposed out of contact with the substrate and facing the back surface thereof; and as the front surface of the substrate is being processed, a step of maintaining the temperature of the substrate within a predetermined range based on results obtained from the temperatures sensed in said first and said second steps of temperature sensing.

2. A method of regulating the temperature of a substrate in the processing thereof as claimed in claim 1, wherein said first and said second steps of temperature sensing comprise using thermopile sensors, which are responsive to any changes in temperature of the substrate, as the sensors for sensing the temperature of heat emitted from the back surface of the substrate.

3. A method of regulating the temperature of a substrate in the processing thereof as claimed in claim 2, and further comprising processing the temperatures sensed by said thermopile sensors into an output representative of the emissivity of the substrate, and wherein said step of maintaining the temperature of the substrate within the predetermined range is carried out based on said output.

4. A method of regulating the temperature of a substrate in the processing thereof as claimed in claim 1, and further comprising heating the substrate with a heater comprising a black body having an emissivity value of unity during said first step of temperature sensing, and generating an output representative of an emissivity value corresponding to the temperature of the black body and the temperature at the back surfce of the substrate, and wherein said step of maintaining the temperature of the substrate within the predetermined range is carried out based on said output.

5. A method of regulating the temperature of a substrate in the processing thereof as claimed in claim 1, and further comprising comparing as measurement obtained by the sensing carried out in said first step with a predetermined set temperature, and initiating the processing of the front surface of the substrate once the temperature of the substrate reaches said set temperature.

6. A method of regulating the temperature of a substrate in the processing thereof as claimed in claim 1, and further comprising comparing a temperature of the substrate obtained by the sensing carried out with a predetermined upper limit temperature value and with a predetermined lower limit temperature value, and activating an alarm whenever the temperature of the substrate exceeds said upper limit temperature value or is below said lower temperature value accompanied by terminating the processing of the front surface of the substrate.

7. In the processing of a front surface of a substrate, a method for regulating the temperature of the substrate, said method comprising:

prior to the processign of the front surface of the substrate, measuring the emissivity of the substrate by using a sensor, that is disposed out of contact with the substrate and faces a back surface thereof opposite said front surface, to sense the temperature of heat emitted from the back surface of the substrate through a space that is free of obstacles;

during the processing of the front surface of the substrate, measuring the emissivity of the substrate of using a sensor, that is disposed out of contact with the substrate and faces the back surface thereof, to sense the temperature of heat emitted from said back surface through a space that is free of obstacles; and processing the measurements of emissivity to obtain the actual temperature of the substrate during processing; and based on the determined actual temperature of the substrate, effecting a heating or cooling of the substrate to maintain the temperature of the substrate within a predetermined range.

8. A method for regulating the temperature of a substrate as claimed in claim 7, and further comprising initiating the processing of the front surface of the substrate once the temperature of the substsrate reaches a predetermined value.

9. A method for regulating the temperature of a substrate as claimed in claim 7, and further comprising comparing the actual temperature of the substrate with a predetermined upper limit temperature value and with a predetermined lower limit temperature value, and activating an alarm whenever the actual temperature exceeds said upper limit temperature value or is below said lower temperature limit value.

10. A method for regulating the temperature of a substrate as claimed in claim 8, and further comprising comparing the measurement obtained in said second step with as predetermined upper limit temperature value and with a predetermined lower limit temperature value, and activating an alarm whenever the measurement obtained in said second step exceeds said upper limit temperature value or is below said lower temperature value.

* * * * *